US005888696A

United States Patent [19]

Hirano et al.

[11] Patent Number: 5,888,696

[45] Date of Patent: Mar. 30, 1999

[54] PLANOGRAPHIC ORIGINAL PLATE REQUIRING NO FOUNTAIN SOLUTION

[75] Inventors: Tsumoru Hirano; Toshifumi Inno; Koji Sonokawa, all of Shizuoka, Japan

[73] Assignee: Fuji Photo Film Co., Ltd., Kanagawa, Japan

[21] Appl. No.: 812,550

[22] Filed: Mar. 7, 1997

[30] Foreign Application Priority Data

Mar. 8, 1996 [JP] Japan .................................... 8-052007

[51] Int. Cl.$^{6}$ ........................................................ G03F 7/11

[52] U.S. Cl. ........................ 430/272.1; 430/303; 430/262; 430/259; 430/945; 101/473; 101/470

[58] Field of Search ................................ 430/272.1, 303, 430/945, 262, 259; 101/473, 470

[56] References Cited

U.S. PATENT DOCUMENTS

| | | | |
|---|---|---|---|
| 3,890,149 | 6/1975 | Schlesinger et al. | 96/33 |
| 3,909,265 | 9/1975 | Miyano et al. | 96/33 |
| 4,743,527 | 5/1988 | Yoshida et al. | 430/303 X |
| 5,188,032 | 2/1993 | Lewis et al. | 101/453 |
| 5,212,048 | 5/1993 | Lewis et al. | 430/272.1 |
| 5,310,869 | 5/1994 | Lewis et al. | 430/272.1 |
| 5,366,844 | 11/1994 | Verburgh et al. | 430/258 |
| 5,487,338 | 1/1996 | Lewis et al. | 101/454 |
| 5,580,704 | 12/1996 | Yoshida et al. | 430/272.1 X |
| 5,786,125 | 7/1998 | Tsuchiya et al. | 430/272.1 |
| 5,786,129 | 7/1998 | Ellis | 430/302 |

FOREIGN PATENT DOCUMENTS

| | | | |
|---|---|---|---|
| 0573091 | 8/1993 | European Pat. Off. . | |
| 2208135 | 6/1974 | France . | |
| 61-293897 | 12/1986 | Japan . | |
| 1442374 | 7/1976 | United Kingdom | 430/303 |
| 94/01280 | 1/1994 | WIPO | 430/303 |

OTHER PUBLICATIONS

Tawara et al, 61–293897, Patent Abstracts of Japan, Abst. Group M 592, vol. 11, No. 160, pub date May 23, 1987, English Abstract of Laid open Japanese Patent Application 61–293897.

74–42113v, Derwent Information, LTD. WPIDS File, is English Abstract of French Patent No. 2208135 dated May 30, 1974.

*Primary Examiner*—Cynthia Hamilton
*Attorney, Agent, or Firm*—Sughrue, Mion, Zinn, Macpeak & Seas, PLLC

[57] ABSTRACT

A planographic original plate requiring no fountain solution, in which a layer allowing adhesion thereof with a silicone rubber layer to decrease through transforming a laser beam into heat and the silicone rubber layer of an addition type containing 10 to 20% by weight of organohydrogenpolysiloxane based on solid content are laminated to a support in this order, thereby providing a planographic original plate requiring no fountain solution which is capable of heat mode recording due to a laser beam and is excellent in image reproducibility and resistance to scratching.

2 Claims, No Drawings

PLANOGRAPHIC ORIGINAL PLATE REQUIRING NO FOUNTAIN SOLUTION

FIELD OF THE INVENTION

The present invention relates to a planographic original plate requiring no fountain solution which can be used for printing through heat mode recording due to a laser beam without using any fountain solution (hereinafter referred to as a "no water-planographic original plate"), and particularly, to a no-water planographic original plate which is satisfactory in resistance to scratching and image reproducibility.

BACKGROUND OF THE INVENTION

Conventional printing systems requiring a fountain solution are difficult to adjust subtle balance between the fountain solution and ink, resulting in emulsifying ink or mixing the fountain solution with ink, which causes unstable ink concentration, scumming, and broke. The no water-planographic original plate, in contrast, has various advantages stemming from requiring no fountain solution.

On the other hand, recent rapid progress in output systems such as prepress systems, image setters, and laser beam printers enables printed images to be converted into digital data. With such progress, systems to prepare printing plates according to novel platemaking processes such as a computer-to-plate process or a computer-to-cylinder process come to be proposed, and new types of printing materials pertinent to these printing systems has been expected and developed. Of these systems, examples of processes for making the no water-planographic printing plates by write with a laser beam include those described in JP-B-42-21879 (The term "JP-B" as used herein means an "examined Japanese patent publication"), JP-A-50-158405 (The term "JP-A" as used herein means as an "unexamined published Japanese patent application"), JP-A-5-94008, JP-A-6-55723, JP-A-6-186750, JP-A-7-314934, U.S. Pat. No. 5,353,705, and WO-9401280. For performing printing without using the solution, it is stated in these specifications that an ink-repellent silicone rubber layer is provided on a layer transforming light into heat (hereinafter referred to as a "light-heat transforming layer") which comprising a laser beam-absorbing agent such as carbon black and a self-oxidative binder such as nitrocellulose, or on a metal deposition layer, and that a part of laser beam-irradiated areas of the silicone rubber layer is removed so that the removed areas become ink-receptive.

In this process, the removal of the silicone rubber layer however relies on abrasion of the light-heat transforming layer due to the laser beam irradiation, and therefore, printed images are inferior in linearity of fine lines and roundness of halftone dots, so that improvements therein are fully expected. Further, inherently poor adhesion between the light-heat transforming layer and the silicone rubber layer often causes the printing plate to suffer damage on handling or during printing, and the damaged areas are inked to form undesired images in these portions, which is a fatal drawback to the printing plate. Although it is described in some specifications that a silane coupling agent is added to the silicone rubber layer to compensate for this drawback, this is insufficient to increase the adhesion of the light-heat transforming layer with the silicone rubber layer, and also has little effect on improvement in resistance to scratching.

SUMMARY OF THE INVENTION

An object of the present invention is to provide a planographic original plate requiring no fountain solution which has good image reproducibility and is capable of write with a laser beam.

Another object of the present invention is to provide a planographic original plate requiring no fountain solution which has good resistance to scratching and is capable of write with a laser beam.

As a result of intensive studies, the present inventors have found that the objects of the present invention can be achieved by a planographic original plate requiring no fountain solution in which a layer allowing adhesion thereof with an silicone rubber layer to decrease through transforming a laser beam into heat and the silicone rubber layer of an addition type containing 10 to 20% by weight of an organohydrogenpolysiloxane based on solid content are laminated to a support in this order.

Although the reason for this effect is not yet clear, the adhesion between the silicone rubber layer and the light-heat transforming layer is supposed to increase in areas unexposed to a laser beam and to extremely decrease in areas exposed to the laser beam by use of the organohydrogenpolysiloxane in the amount specified above, thereby bringing about improvement in the resistance to scratching and the image reproducibility.

DETAILED DESCRIPTION OF THE INVENTION

The present invention is described in detail below.

[Silicone Rubber Layer of Addition Type]

The addition type-silicone rubber layer used in the present invention is a crosslinkable film formed by curing the following composition:

(a) A diorganopolysiloxane having an addition-reactive functional group (b) An organohydrogenpolysiloxane (c) An addition catalyst Component (a), a diorganopolysiloxane having an addition-reactive functional group, is an organopolysiloxane having at least two alkenyl groups (preferably vinyl group) directly linked to silicon atoms in molecule, and the alkenyl groups may exist either at the terminal or in the middle of the molecule. In addition to the alkenyl groups, organic groups in which component (a) may contain, are substituted or unsubstituted alkyl groups or aryl groups having 1 to 10 carbon atoms, and component (a) can arbitrarily contain a small number of a hydroxyl group.

The number average molecular weight of component (a) is preferably from 3,000 to 100,000, and more preferably from 10,000 to 70,000. The content of component (a), based on the whole solid content in the silicone rubber layer, is preferably from 60 to 90% by weight, and more preferably from 70 to 88% by weight.

Examples of component (b) include polydimethylsiloxane containing hydrogen atoms at both the terminal positions in the molecule, α,ω-dimethylpolysiloxane, methylsiloxane/dimethylsiloxane copolymers containing methyl groups at both the terminal positions in the molecules, cyclic polymethyl-siloxane, polymethylsiloxane containing trimethylsilyl groups at both the terminal positions in the molecule, and dimethyl-siloxane/methylsiloxane copolymers containing trimethylsilyl groups at both the terminal positions in the molecules. The content of component (b), based on the whole solid content in the silicone rubber layer, is from 10 to 20% by weight, and more preferably from 11 to 18% by weight. The content exceeding 20% by weight results in deterioration in curability of the silicone rubber layer to make it difficult to form a heat-cured silicone rubber layer, whereas the content of less than 10% by weight makes it impossible to attain the objects of the present invention.

Examples of component (b), organohydrogenpolysiloxane, are as follows:

(1) $(CH_3)_3Si—O—(SiH(CH_3)—O)_8—Si(CH_3)_3$ (2) $(CH_3)_3Si—O—(SiH(CH_3)—O)_6—(Si(CH_3)_2—O)_4—Si(CH_3)_3$ (3) $(CH_3)_3Si—O—(SiH(CH_3)—O)_{20}—(Si(CH_3)_2—O)_{20}$-$Si(CH_3)_3$ (4) $(CH_3)_2SiH—O—(SiH(CH_3)—O)_8—SiH(CH_3)_2$ (5) $(CH_3)_3Si—O—(SiH(CH_3)—O)_{15}—(Si(CH_3)_2—O)_5—Si(CH_3)_3$

Among these, compounds of the above items (1) and (2) are preferred.

Component (c) can be selected from among well-known addition catalysts, and particularly, platinum compounds are preferred, which include simple substance of platinum, platinum chloride, chloroplatinic acid, platinum containing olefins as ligands.

To control the curing speed of the composition, the composition can also contain a crosslinking inhibitor such as organopolysiloxanes having a vinyl group such as tetracyclo (methylvinyl)siloxane, alcohols having a carbon-carbon triple bond, acetone, methyl ethyl ketone, methanol, ethanol, or propylene glycol monomethyl ether. The content of component (c), based on the whole solid content in the silicone rubber layer, is preferably from 0.00001 to 1% by weight, and more preferably from 0.0001 to 0.1% by weight.

Further, an inorganic fine powder such as silica, calcium carbonate and titanium oxide or an adhesive aid such as silane coupling agents, titanate coupling agents and aluminum coupling agents may be incorporated into the silicone rubber layer as needed.

In the present invention, a thin silicone rubber layer results in decrease in ink repellency and resistance to scratching, whereas a thick silicone rubber layer results in deterioration in image reproducibility. For these reasons, the amount of the silicone rubber layer to be formed is preferably from 0.5 to 5 $g/m^2$, and more preferably from 1 to 3 $g/m^2$.

In the planographic original plate requiring no fountain solution of the present invention, various silicone rubber layers may be further provided on the silicone rubber layer mentioned above.

Further, in order to protect the surface of the silicone rubber, a transparent film such as polyethylene, polypropylene, polyvinyl chloride, polyvinylidene chloride, polyvinyl alcohol, polyethylene terephthalate, and cellophane may be laminated to the silicone rubber layer, or a polymer solution may be applied to the layer. The above films may be oriented prior to the application thereof. It is preferred that the surface of the planographic original plate of the present invention is not subjected to matte finish, although it may be performed in some cases.

[Support]

Supports of the planographic original plates requiring no fountain solution are required to have flexibility to the extent that the supports can be set on conventional printing machines, and to sufficiently withstand a load imposed during printing at the same time. Typical examples of the supports include metal plates such as aluminum plates; alloy plates of aluminum with other metals such as silicon, copper, manganese, magnesium, chromium, zinc, lead, bismuth, or nickel; plastic films such as polyethylene terephthalate, and polyethylene naphthalate; and composite sheets in which a plastic film such as polyethylene, polypropylene, and the like is laminated to paper.

The thickness of the supports is preferably from 25 $\mu$m to 3 mm, and more preferably from 75 to 500 $\mu$m. Although the most pertinent thickness varies with the kind of the supports and printing conditions, it is from 100 to 300 $\mu$m in general.

In the present invention, the support can be subjected to surface treatment such as corona discharge, or a primer layer can be formed on the support in order to improve the adhesion of the support and the light-heat transforming layer, to improve printability, or to enhance sensitivity. The primer layers used in the present invention include layers formed of various photopolymers cured by exposure prior to formation of photosensitive resin layers as disclosed, for example, by JP-A-60-22903; layers formed of epoxy resins heat-cured as disclosed by JP-A-62-50760; layers formed of gelatin hardened as disclosed by JP-A-63-133151; layers formed of urethane resins and silane coupling agents as disclosed by JP-A-3-200965; and layers formed of urethane resins as disclosed by JP-A-3-273248. Layers formed from gelatin or casein by hardening are effective as well.

The above primer layers may further contain polymers such as polyurethane, polyamide, a styrene/butadiene rubber, a carboxy-modified styrene/butadiene rubber, an acrylonitrile/butadiene rubber, a carboxy-modified acrylonitrile/butadiene rubber, polyisoprene, an acrylate rubber, polyethylene, chlorinated polyethylene, chlorinated polypropylene, a vinyl chloride/ vinyl acetate copolymer, nitrocellulose, halogenated polyhydroxystyrene, and a chlorinated rubber. The amount of these polymers to be used is arbitrary, and the primer layers may be formed only of these polymers as long as the layers can be formed. Adhesive aids (for example, polymerizable monomers, diazo resins, silane coupling agents, titanate coupling agents and aluminum coupling agents) or dyes may be further incorporated into these primer layers as well. They can also be cured by exposure after coating.

The primer layers efficiently act as ink-receptive layers in areas from which the silicone rubber layers are removed, and are particularly effective for ink-unreceptive supports such as metallic supports. The primer layers also have the role of cushions to buffer the pressure applied on the silicone rubber layers during printing.

In general, the amount of the primer layers to be formed ranges in general from 0.05 to 10 $g/m^2$, preferably from 0.1 to 8 $g/m^2$, and more preferably from 0.2 to 5 $g/m^2$ in dry weight.

[Layer Allowing Adhesion Thereof with Silicone Rubber Layer to Decrease through Transforming Laser beam into Heat]

The light-heat transforming layer used in the present invention fulfils a function of transforming a laser beam for write into heat (light-heat transformation) to decrease the adhesion thereof to the silicone rubber layer. The well-known light-heat transforming layers having this function can be used in the present invention. When an infrared laser beam is selected among well-known laser beam sources, various organic and inorganic materials absorbing infrared laser beams for write can be used, including infrared absorbing dyes, infrared absorbing pigments, infrared absorbing metals, and infrared absorbing metal oxides. To form the layer, these materials can be employed either singly or in admixture with other components such as binders and additives.

The layer composed of a single material can be formed on a support by depositing or spattering one of metals or alloys (such as aluminum, titanium, tellurium, chromium, tin, indium, bismuth, zinc, and lead), oxides, carbides, nitrides, borides, or fluorides of the above metals, or organic dyes. The layer formed of a mixture can be prepared by dissolving or dispersing a light-heat transforming material together with other components followed by coating a support with the resulting solution or dispersion.

Examples of the light-heat transforming materials include organic pigments such as carbon blacks (for example, acidic carbon black, basic carbon black, and neutral carbon black), carbon blacks which are subjected to surface modification or surface coating to improve dispersibility, and nigrosines; various compounds described as organic dyes in Matsuoka, Sekigai Zokan Shikiso (Infrared Sensitizing Dyes), Plenum Press, New York, N.Y. (1990), U.S. Pat. No. 4,833,124, European Patent 321,923, U.S. Pat. Nos. 4,772,583, 4,942,141, 4,948,776, 4,948,777, 4,948,778, 4,950,639, 4,912,083, 4,952552, and 5,023,229; metals such as aluminum and metal oxides such as indium tin oxide, tungsten oxide, manganese oxide, and titanium oxide; and electrically conductive polymers such as polypyrrole and polyaniline.

The light-heat transforming layers formed of a mixture can appropriately contain binders which include well-known binders capable of dissolving or dispersing the light-heat transforming materials. Examples of such binders include celluloses such as nitrocellulose and ethyl cellulose; cellulose derivatives; homopolymers and copolymers of acrylic esters or methacrylic esters such as polymethyl methacrylate and polybutyl methacrylate; homopolymers and copolymers of styrene type monomers such as styrene and α-methylstyrene; various synthetic rubbers such as polyisoprene and styrene/ butadiene rubbers; homopolymers of vinyl esters such as polyvinyl acetate and copolymers of vinyl esters such as vinyl acetate/vinyl chloride copolymers; various condensation polymers such as polyurea, polyurethane, polyester, and polycarbonate; and binders used for the so-called "chemical amplification system" as described in Frechet, et al. *J. Imaging Sci.,* 30 (2), pp. 59-64 (1986); Ito and Willson, *Polymers in Electronics* Symposium Series, P11,242, Edited by T. Davidson, ACS Washington, DC (1984); E. Reichmanis and L. F. Thompson, Microelectronic Engineering, pp. 3–10 and 13 (1991).

In addition to the light-heat transforming materials and the binders, various additives can be incorporated into the light-heat transforming layer composed of a mixture. These additives are selected according to various purposes; to improve mechanical strength of the light-heat transforming layer, to improve laser recording sensitivity, to improve dispersibility of dispersing materials into the light-heat transforming layer, or to improve adhesion of a support or a primer layer to layers adjacent to them. For example, crosslinking in the light-heat transforming layer is thought as a means of improving the mechanical strength of the light-heat transforming layer, and in such a case, various crosslinking agents can be incorporated into the layers.

To improve the laser recording sensitivity, well-known compounds to produce gases by thermal decomposition may be added to the layers. In this case, rapid expansion in volume in the light-heat transforming layer makes it possible to improve the laser recording sensitivity. Examples of such compounds include dinitropentamethylenetetramine, N,N'-dimethyl-N,N'-dinitrosoterephthalamide, p-toluenesulfonyl hydrazide, 4,4'-oxybis(benzenesulfonyl hydrazide), and diamidobenzene.

Further, well-known compounds to produce acidic compounds by thermal decomposition can also be employed as the additives. Combination use of the above compounds with binders for the chemical amplification system causes the decomposition temperature of these constituent substances in the light-heat transforming layer to greatly decrease, thus resulting in improvement in the laser recording sensitivity. Examples of such additives are iodonium salts, sulfonium salts, phosphonium tosylates, oxime sulfonates, dicarbodiimide sulfonates, and triazines. Use of the pigments such as carbon blacks as the light-heat transforming materials often brings about possibility that the degree of dispersion of the pigments has influence on the laser recording sensitivity, and therefore, pigment dispersing agents can also be used as additives. To improve the adhesion, well-known adhesion improvers such as silane coupling agents and titanate coupling agents may be incorporated into the light-heat transforming layer.

In addition, various other additives, for example, surfactants for improving coating properties, can be used as needed.

The light-heat transforming layer formed of a single material is prepared by the depositing or spattering method. The thickness of the layer is preferably from 50 to 1000 Å, and more preferably from 100 to 800 Å. The layer forming of a mixture is prepared by the coating method. The thickness of the layer is preferably from 0.05 to 10 $\mu$m, and more preferably from 0.1 to 5 $\mu$m. A too thick light-heat transforming layer brings about unfavorable results such as decrease in the laser recording sensitivity.

In the present invention, laser beam energy used for recording is absorbed in the light-heat transforming layer of the planographic original plate requiring no fountain solution to be transformed into heat energy, which induces reactions or physical changes such as combustion, melting, decomposition, evaporation, or explosion, thus resulting in decreasing the adhesion between the light-heat transforming layer and the silicone rubber layer.

In the present invention, the planographic original plate requiring no fountain solution is exposed to a laser beam. The laser beam used is not particularly limited, as long as exposure amount enough to peel and remove the silicone rubber layer and to decrease the adhesion between the light-heat transforming layer and the silicone rubber layer is assured. Examples of such laser beams are gas laser beams such as an argon laser beam and a carbon dioxide gas laser beam, solid state laser beams such as a YAG laser beam, semiconductor laser beams, or the like. Their required grades in output are 50 mW or more in general. From the practical viewpoint of maintenance or cost, semiconductor laser beams and semiconductor-excited solid state laser beams such as a YAG laser beam are preferably employed.

The recording wavelengths of these laser beams are in the infrared region, and an oscillating wavelength of 800 to 1100 nm is often utilized. Exposure can be carried out with the aid of an imaging system described in JP-A-6-18750.

The film to protect the surface of the silicone rubber layer may be exposed to a laser beam, either without peeling or after peeling.

Although well-known developers for planographic original plates requiring no fountain solution can be used for the planographic original plate of the present invention, preferred developers are, in view of safety, water or water-soluble organic solvent solution containing water as a main component. From the viewpoint of safety and inflammability, it is preferred that the concentration of water-soluble organic solvent solution is less than 40% by weight. Well-known solvents used for this purpose are polar solvents themselves as given below, or mixtures thereof with aliphatic hydrocarbons such as hexane, heptane, "Isopar E, H, and G" (manufactured by Esso Chemical Co., Ltd.), gasoline and kerosine; aromatic hydrocarbons such as toluene or xylene; and halogenated hydrocarbons such as trichlene. The polar solvents are as follows:

Alcohols: methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, etc.

Ketones: acetone, methyl ethyl ketone, etc.

Esters: ethyl acetate, methyl lactate, butyl lactate, propylene glycol monomethyl ether acetate, diethylene glycol acetate, diethyl phthalate, etc.

Others: triethyl phosphate, tricresyl phosphate, etc.

Further, developers used in the present invention include the above organic solvent developers to which water is added, the above organic solvents solubilized in water by use of surfactants, these developers to which alkalis such as sodium carbonate, diethanolamine and sodium hydroxide are further added, and simple water such as tap water, pure water, and distilled water. Development is performed by well-known methods, that is, by rubbing the surface of an original plate with a developing pad soaked with a developer mentioned above, or by pouring a developer over the surface of an original plate followed by rubbing the surface with a developing brush in water. Although the temperature of the developer is not necessarily limited, it is preferably from 10° to 50° C. The silicone rubber layer in image areas is removed by this operation to make the image areas ink-receptive.

The development mentioned above, and subsequent washing and drying can also be carried out with an automatic processor. A preferred automatic processor is that described in JP-A-2-220061. The planographic original plate of the present invention can also be developed by laminating an adhesive layer to the surface of the original plate followed by peeling the adhesive layer. Any of well-known adhesive layers which can adhere to a silicone rubber layer can be used. Products in which such adhesive layers are provided on flexible supports are commercially available, and for example, "Scotch Tape #851A" (trade name) manufactured by Sumitomo-Minnesota Mining and Manufacturing Co. can be employed for this purpose. When the printing plates thus processed are stacked for storage, it is preferred to alternately put interleaving sheets between the printing plates to protect.

EXAMPLE

The present invention is illustrated by means of examples in more detail. However, the present invention is not limited by these examples.

Examples 1 to 8 and Comparative Examples 1 to 4
[Support]

A gelatin undercoat layer was formed as a primer layer on a 175 μm-thick polyethylene terephthalate film so as to be 0.2 μm in dry thickness.

[Preparation of Carbon Black Dispersion]

A composition given below was dispersed with a paint shaker for 30 minutes, and then, glass beads were separated by filtration to prepare a carbon black dispersion.

| | |
|---|---|
| Carbon Black (#40, manufactured by Mitsubishi Carbon Co., Ltd.) | 5.0 g |
| Crisvon 3006LV (polyurethane manufactured by Dainippon Ink and Chemicals, Inc.) | 4.0 g |
| Nitrocellulose (containing 30% by weight of n-propanol) | 1.3 g |
| Solsperse S27000 (manufactured by Imperial Chemical Industry) | 0.4 g |
| Propylene Glycol Monomethyl Ether | 45 g |
| Glass Beads | 160 g |

[Formation of Light-Heat Transforming Layer]

The following solution is coated on the above-mentioned polyethylene terephthalate film having the gelatin undercoat layer so as to be 2 μm in dry thickness, thus forming a light-heat transforming layer.

| | |
|---|---|
| Carbon Black Dispersion described above | 55 g |
| Nitrocellulose (containing 30% by weight of n-propanol) | 4.0 g |
| Propylene Glycol Monomethyl Ether | 45 g |

[Formation of Silicone Rubber Layer]

The following solutions were coated on the above light-heat transforming layer, and then dried at 1100° C. for 1 minute to prepare an addition type silicone rubber layer having a dry thickness of 2 μm.

| | |
|---|---|
| Dimethylpolysiloxane described in Table 1 which was added as a base polymer | |
| Organohydrogenpolysiloxane described in Table 1 which was added as a crosslinking agent | |
| Olefin-Chloroplatinic Acid | 0.001 g |
| Inhibitor ($CH{\equiv}C—C(CH_3)_2—O—Si—(CH_3)_3$) | 0.3 g |
| Isopar G (manufactured by Esso Chemical Co., Ltd.) | 120 g |

Six μm-thick polyethylene terephthalate films were laminated on the silicone rubber layers thus formed.

TABLE 1

| | Base Polymers | | Crosslinking Agents | | Ratio of Crosslinking Agents to Silicone |
|---|---|---|---|---|---|
| Samples | Compounds | Amount (g) | Compounds | Amount (g) | Rubber Layers (%) |
| Example 1 | A | 9.0 | a | 1.2 | 11.4 |
| Example 2 | B | 9.0 | a | 1.2 | 11.4 |
| Example 3 | C | 9.0 | a | 1.2 | 11.4 |
| Example 4 | D | 9.0 | a | 1.2 | 11.4 |
| Example 5 | A | 9.0 | b | 1.8 | 16.2 |

TABLE 1-continued

| | Base Polymers | | Crosslinking Agents | | Ratio of Cross-linking Agents to Silicone |
|---|---|---|---|---|---|
| Samples | Compounds | Amount (g) | Compounds | Amount (g) | Rubber Layers (%) |
| Example 6 | A | 9.0 | c | 1.5 | 13.9 |
| Example 7 | A | 9.0 | a | 0.8 | 12.3 |
| | | | b | 0.5 | |
| Example 8 | B | 9.0 | b | 1.0 | 13.9 |
| | | | d | 0.5 | |
| Comparative Example 1 | A | 9.0 | a | 0.5 | 5.1 |
| Comparative Example 2 | A | 9.0 | a | 2.5 | 21.2 |
| Comparative Example 3 | B | 9.0 | b | 0.7 | 7.0 |
| Comparative Example 4 | C | 9.0 | c | 0.8 | 7.9 |

Compound A $$CH_2=CH-Si(CH_3)_2-O-(Si(CH_3)_2-O)_{500}-Si(CH_3)_2-CH=CH_2$$

Compound B $$CH_2=CH-Si(CH_3)_2-O-(Si(CH_3)_2-O)_{700}-Si(CH_3)_2-CH=CH_2$$

Compound C $$(CH_2=CH)_3-SiO-(Si(CH_3)_2-O)_{500}-Si(CH=CH_2)_3$$

Compound D

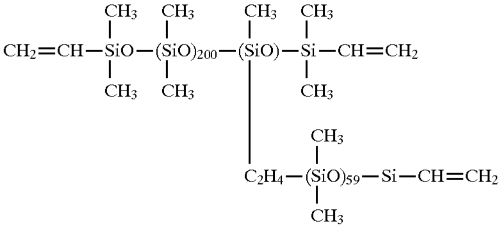

Compound a $$(CH_3)_3Si-O-(SiH(CH_3)-O)_8-Si(CH_3)_3$$

Compound b $$(CH_3)_3Si-O-(SiH(CH_3)-O)_6-(Si(CH_3)_2-O)_4-Si(CH_3)_3$$

Compound c $$(CH_3)_3Si-O-(SiH(CH_3)-O)_{20}-(Si(CH_3)_2-O)_{20}-Si(CH_3)_3$$

Compound d $$(CH_3)_2SiH-O-(SiH(CH_3)-O)_8-SiH(CH_3)_2$$

After the cover films were peeled from the thus prepared planographic original plates requiring no fountain solution of the present invention, write of continuous lines therein was performed by the use of a semiconductor-excited YAG laser beam having a wavelength of 1064 nm and a beam diameter of 40 μm ($1/e^2$) The recording energy was adjusted to 700 mJ/cm$^2$. The surfaces of the original plates were wiped with a developing pad soaked with isopropanol to remove laser beam-exposed areas from the silicone rubber layers. On the other hand, unexposed areas of the silicone rubber layers were not removed to be retained on the surfaces of the planographic original plate requiring no fountain solution, thus forming silicone images having sharp edges. Further, write on the planographic original plate requiring no fountain solution was performed with a semiconductor laser beam having an output of 110 mW, a wavelength of 825 nm, and a beam diameter of 10 μm ($1/e^2$) at a main operating speed of 6 m/second, and then, the planographic original plates were developed by the same method as described above. Thus, planographic printing plate requiring no fountain solution having a resolving power of 7 μm and sharp edges were prepared. Under the same recording conditions, a halftone dot formation of 200 lines was performed so that a halftone dot area ratio of 2 to 98% was attained on the printing plates. On the non-image areas of the planographic printing plates requiring no fountain thus prepared, lines were written by use of HEIDON (manufactured by Shinto Chemical Co., Ltd.) with a 0.25 mm-size sapphire needle to which a load of 100 g was applied to examine the scratching resistance of the silicone rubber layers. 20,000 Sheets of good scumless printed matter were obtained from the thus prepared planographic printing plates requiring no fountain solution which were set on a printing machine.

In the same manner as in examples 1 to 8, write on the planographic original plate requiring no fountain solution of comparative examples 1, 3, and 4 (The plano-graphic original plates of comparative example 2 failed to be cured and undergo the exposure test) was performed with the semiconductor-excited YAG laser beam and the semiconductor laser beam, and then, the original plates were developed. However, the planographic printing plates requiring no fountain solution had various disadvantages in that, for example, recorded images formed on the printing plates had indistinct edges, and further, as printing proceeded, silicone rubber dropped from the edge portions of the images to cause image areas to increase. Further, the halftone dot formation of 200 lines was performed so that a halftone dot area ratio was only from 4 to 96%, producing halftone dots with fringes.

Similarly to examples 1 to 8, the scratching resistance of these printing plates was examined, and as a result, scratched portions were found to undergo inking during printing, resulting in scumming.

Examples 9 to 14 and Comparative Examples 5 and 6

[Formation of Light-Heat Transforming Layer]

Titanium was deposited under a pressure of $5\times10^{-5}$ Torr on a 180 μm-thick polyethylene terephthalate film treated with corona discharge so as to be OD (Optical Density)= 0.65 (1064 nm).

[Formation of Silicone Rubber Layer]

A solution having the following composition was coated on the above titanium-deposited surface, and dried at 110° C. for 1 minute to form an addition type silicone rubber layer having 2 μm in dry thickness.

| | |
|---|---|
| Dimethylpolysiloxane used as a base polymer as described in Table 2 | |
| Hydrogenpolysiloxane used as a crosslinking agent as described in Table 2 | |
| Olefin-Chloroplatinic Acid | 0.001 g |
| Inhibitor ($CH{\equiv}C{-}C(CH_3)_2{-}O{-}Si{-}(CH_3)_3$) | 0.3 g |
| Isopar G (manufactured by Esso Chemical Co., Ltd.) | 140 g |

Six μm-thick polyethylene terephthalate films were laminated on the surfaces of the silicone rubber layers thus prepared.

TABLE 2

| | Base Polymers | | Crosslinking Agents | | Ratio of Cross-linking Agents to Silicone |
|---|---|---|---|---|---|
| Samples | Compounds | Amount (g) | Compounds | Amount (g) | Rubber Layers (%) |
| Example 9 | A | 9.0 | a | 1.3 | 12.3 |
| Example 10 | B | 9.0 | a | 1.3 | 12.3 |
| Example 11 | D | 9.0 | a | 1.3 | 12.3 |
| Example 12 | E | 9.0 | b | 1.5 | 13.9 |
| Example 13 | A | 9.0 | e | 1.8 | 16.2 |
| Example 14 | B | 9.0 | a | 0.7 | 11.4 |
| | | | b | 0.5 | |
| Comparative Example 5 | A | 9.0 | a | 0.5 | 5.1 |
| Comparative Example 6 | B | 9.0 | a | 0.3 | 5.1 |
| | | | b | 0.2 | |

Compound E

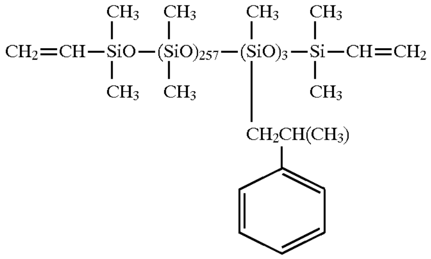

Compound e $$(CH_3)_3Si-O-(SiH(CH_3)-O)_{15}-(Si(CH_3)_2-O)_5-Si(CH_3)_3$$

After the cover films were peeled from the thus prepared planographic original plates requiring no fountain solution of the present invention, write of continuous lines was performed by the use of a semiconductor-excited YAG laser beam having a wavelength of 1064 nm and a beam diameter of 40 μm (1/e$^2$). The recording energy was adjusted to 700 mJ/cm$^2$. Then, the surfaces of the original formes were wiped with a developing pad soaked with isopropanol to remove laser beam-exposed areas from the silicone rubber layer. On the other hand, laser beam-unexposed areas thereof were not removed to be retained on the surfaces of the planographic original plates requiring no fountain solution, which forms silicone images having sharp edges. Further, write on the planographic original plates requiring no fountain solution was performed by the use of the semiconductor laser beam having an output of 110 mW, a wavelength of 825 nm, and a beam diameter of 10 μm (1/e$^2$) at a main operating speed of 5 m/second, and the planographic original plates were developed by the same method as that described above. The planographic printing plates requiring no fountain solution having a resolving power of 7 μm and sharp edges were prepared. Under these recording conditions, the halftone dot formation of 200 lines was performed so that a halftone dot area ratio of 2 to 98% was attained on the printing plates. On the non-image areas of the thus prepared planographic printing plates requiring no fountain solution, lines were written by the use of HEIDON (manufactured by Shinto Chemical Co., Ltd.) with a 0.25 mm-size sapphire needle to which a load of 100 g was applied to examine the resistance thereof to scratching. 20,000 Sheets of scumless, good printed matter were obtained from the thus prepared planographic printing plates requiring no fountain solusion which were set on a printing machine.

On the other hand, in the same manner as in examples 9 to 14, write on the planographic original plates requiring no fountain solution of comparative 5 and 6 was performed with the semiconductor-excited YAG laser beam and the semiconductor laser beam, and then, the original plates were developed. However, the planographic printing plates requiring no fountain solution had various disadvantage in that, for example, recorded images formed on the printing plates had indistinct edges, and further, as printing proceeded, silicone rubber dropped from the edge portions of images, resulting in increase in image areas. The halftone dot formation of 200 lines was performed so that the halftone dot area ratio was only from 4 to 96%, producing halftone dots with fringes. Further, similarly to examples 9 to 14, the scratching resistance of these planographic printing plates was examined, and as a result, scratched portions were found to undergo inking during printing, resulting in scumming.

Example 15

[Support]

A solution having the following composition was coated to a 0.24 mm-thick aluminum support so as to be 1 μm in dry thickness, and then dried at 100° C. for 1 minute, thus forming a primer layer.

| | |
|---|---|
| Sanprene IB1700D (Polyurethane manufactured by Sanyo Chemical Industries, Ltd.) | 10 g |
| Hexafluorophosphoric Acid Salts of, Condensation Polymerization Product of p-Diazophenylamine with Paraformaldehyde | 0.1 g |

-continued

| | |
|---|---|
| $TiO_2$ | 0.1 g |
| Defenser MCF323 (Surfactant manufactured by Dainippon Ink and Chemicals, Inc.) | 0.03 g |
| Propylene Glycol Methyl Ether Acetate | 50 g |
| Methyl Lactate | 20 g |
| Pure Water | 1 g |

Thereafter, the primer layer was exposed to light by the use of a vacuum exposure device "FT261V UDNS ULTRA-PLUS FLIPTOP PLATE MAKER" manufactured by Nu Arc Corp. for 20 counts.

[Formation of Light-Heat Transforming Layer]

A composition given below was dispersed with a paint shaker for 30 minutes, and glass beads were separated by filtration to prepare a coating solution for a light-heat transforming layer. This coating solution was coated to the above-mentioned primer layer so as to be 2 μm in dry thickness, thus forming the light-heat transforming layer.

| | |
|---|---|
| Carbon Black (#40, Manufactured by Mitsubishi Carbon Co., Ltd.) | 5.0 g |
| Nipporan 2304 (Polyurethane manufactured by Nippon Polyurethane Co., Ltd.) | 3.0 g |
| Solsperse S20000 (manufactured by Imperial Chemical Industry) | 0.27 g |
| Solsperse S12000 (manufactured by Imperial Chemical Industry) | 0.22 g |
| Nitrocellulose (containing 30% by weight of 1-Propanol) | 3.2 g |
| Methyl Ethyl Ketone | 50 g |
| Propylene Glycol Monomethyl Ether | 50 g |
| Glass Beads | 160 g |

[Formation of Silicone Rubber Layer]

A solution having composition given below was coated on the above light-heat transforming layer, and then dried at 110° C. for 1 minute to form an additional type silicone rubber layer having 2 μm in dry thickness.

| | |
|---|---|
| α,ω-Divinylpolydimethylsiloxane (polymerization degree: about 700) | 9.00 g |
| $(CH_3)_3$—Si—O—$(SiH(CH_3)—O)_8$—$Si(CH_3)_3$ | 1.35 g |
| Polydimethylsiloxane (polymerization degree: about 8000) | 0.30 g |
| Olefin-Chloroplatinic Acid | 0.001 g |
| Inhibitor [HC≡C—$C(CH_3)_2$—O—$Si(CH_3)_3$] | 0.2 g |
| Isopar G (manufactured by Esso Chemical Co., Ltd.) | 140 g |

A 6 μm-thick polyethylene terephthalate film was laminated on the surface of the silicone rubber layer prepared as described above.

After the cover film was peeled from the thus obtained planographic original plate requiring no fountain solution, a continuous line was written with the semiconductor-excited YAG laser beam having a wavelength of 1064 nm and a beam diameter of 40 μm ($1/e^2$). The recording energy was adjusted to 700 mJ/cm$^2$. Thereafter, Scotch Tape #851A (manufactured by Sumitomo-Minnesota Mining and Manufacturing Co.) was laminated to the surface of the silicone rubber layer, and then, peeled from it to remove laser beam-exposed areas from the silicone rubber layer. Then, laser beam-unexposed areas of the silicone rubber layer were not removed to be retained on the planographic original plate requiring no fountain solution, which forms silicone images having sharp edges.

Further, write on the planographic original plate requiring no fountain solution was performed by the use of the semiconductor laser beam having an output of 110 mW, a wavelength of 825 nm, and a beam diameter of 10 μm ($1/e^2$) at a main operating speed of 6 m/second, and treated in the same manner as described above to remove laser beam-exposed areas from the silicone rubber layer. The resulting planographic printing plate requiring no fountain solution had a recording sensitivity of 200 mJ/cm$^2$ and a resolving power of 8 μm, and formed images with sharp edges. Under these recording conditions, the halftone dot formation of 200 lines was conducted to attain a halftone dot area ratio of 2 to 98% on the printing forme.

Further, lines were written on the non-image areas of the planographic printing plate requiring no fountain solution by use of HEIDON (manufactured by Shinto Chemical Co., Ltd.) with a 0.25 mm-size sapphire needle to which a load of 100 g was applied to examine the scratching resistance of the silicone rubber layer. 100,000 Sheets of scumless, good printed matter were obtained from the planographic printing plate requiring no fountain solution which was set on a printing machine.

Thus, the planographic original plates requiring no fountain solution of the present invention have been found to be capable of heat mode recording due to laser beams and to be excellent in image reproducibility and resistance to scratching.

While the invention has been described in detail and with reference to specific embodiments thereof, it will be apparent to one skilled in the art that various changes and modification can be made therein without departing from the spirit and scope thereof.

What is claimed is:

1. A planographic original plate requiring no fountain solution, comprising:

a support, a light-heat transforming layer and a silicone rubber layer, wherein said light-heat transforming layer is laminated onto said support and said silicone rubber layer is adhered to said light-heat transforming layer, wherein the adhesion between said light-heat transforming layer and said silicone rubber layer decreases through transforming a laser beam into heat, wherein the silicone rubber layer comprises:

(a) a diorganopolysiloxane having an addition-reactive functional group;

(b) an organohydrogenpolysiloxane; and (c) an addition catalyst, wherein said silicone rubber layer contains 10 to 20% by weight of organohydrogenpolysiloxane based on the solids content in the silicone rubber layer.

2. The planographic original plate requiring no fountain solution as claimed in claim 1, wherein the composition contains (a) the diorganopolysiloxane having an addition-reactive functional group in an amount of from 60 to 90% by weight based on the solids content in the silicon rubber layer, (b) the organohydrogenpolysiloxane, in an amount of from 10 to 20% by weight based on the solids content in the silicon rubber layer, and (c) the addition catalyst in an amount of from 0.0001 to 0.1% by weight based on the solids content in the silicon rubber layer.

* * * * *